United States Patent
Liu et al.

(10) Patent No.: US 9,827,740 B2
(45) Date of Patent: Nov. 28, 2017

(54) POLYIMIDES AS LASER RELEASE MATERIALS FOR 3-D IC APPLICATIONS

(71) Applicant: Brewer Science Inc., Rolla, MO (US)

(72) Inventors: Xiao Liu, Rolla, MO (US); Dongshun Bai, Rolla, MO (US); Tony D. Flaim, St. James, MO (US); Xing-Fu Zhong, Rolla, MO (US); Qi Wu, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 160 days.

(21) Appl. No.: 14/805,898

(22) Filed: Jul. 22, 2015

(65) Prior Publication Data

US 2016/0023436 A1    Jan. 28, 2016

Related U.S. Application Data

(60) Provisional application No. 62/027,758, filed on Jul. 22, 2014.

(51) Int. Cl.
 *B32B 38/10* (2006.01)
 *B32B 7/06* (2006.01)
 (Continued)

(52) U.S. Cl.
 CPC ............. *B32B 7/06* (2013.01); *B05D 3/007* (2013.01); *B32B 27/06* (2013.01); *B32B 37/14* (2013.01);
 (Continued)

(58) Field of Classification Search
 CPC ......... Y10T 156/1158; Y10T 156/1917; Y10S 156/93; Y10S 156/941
 See application file for complete search history.

(56) References Cited

U.S. PATENT DOCUMENTS

| | | | | |
|---|---|---|---|---|
| 6,025,113 A | * | 2/2000 | Kikkawa | C08G 73/10 430/283.1 |
| 6,036,809 A | * | 3/2000 | Kelly | B32B 43/00 156/230 |

(Continued)

FOREIGN PATENT DOCUMENTS

| KR | 10-2005-0063493 | 6/2005 |
|---|---|---|
| KR | 10-2009-0017014 | 2/2009 |

(Continued)

OTHER PUBLICATIONS

HD MicroSystems Process Guide, HD-3007 Polyimide Adhesive, Revised May 2009, www.hdmicrosystems.com, 3 pages.

(Continued)

*Primary Examiner* — Mark A Osele
(74) *Attorney, Agent, or Firm* — Hovey Williams LLP

(57) ABSTRACT

The invention broadly relates to release layer compositions that enable thin wafer handling during microelectronics manufacturing. Preferred release layers are formed from compositions comprising a polyamic acid or polyimide dissolved or dispersed in a solvent system, followed by curing and/or solvent removal at about 250° C. to about 350° C. for less than about 10 minutes, yielding a thin film. This process forms the release compositions into polyimide release layers that can be used in temporary bonding processes, and laser debonded after the desired processing has been carried out.

15 Claims, 1 Drawing Sheet

(51) Int. Cl.
  *B05D 3/00*    (2006.01)
  *B32B 27/06*   (2006.01)
  *B32B 37/14*   (2006.01)
  *C09D 179/08*  (2006.01)
  *H01L 21/683*  (2006.01)
  *C08G 73/10*   (2006.01)

(52) U.S. Cl.
  CPC ..... *C08G 73/1014* (2013.01); *C08G 73/1039* (2013.01); *C08G 73/1067* (2013.01); *C09D 179/08* (2013.01); *H01L 21/6835* (2013.01); *B32B 2255/26* (2013.01); *B32B 2307/412* (2013.01); *B32B 2405/00* (2013.01); *B32B 2457/00* (2013.01); *H01L 2221/6834* (2013.01); *H01L 2221/68318* (2013.01); *H01L 2221/68327* (2013.01); *H01L 2221/68381* (2013.01); *Y10S 156/93* (2013.01); *Y10S 156/941* (2013.01); *Y10T 156/1158* (2015.01); *Y10T 156/1917* (2015.01)

(56) References Cited

U.S. PATENT DOCUMENTS

| | | | |
|---|---|---|---|
| 6,294,407 B1 * | 9/2001 | Jacobs | H01L 21/4839 438/108 |
| 7,084,493 B2 * | 8/2006 | Funada | G11B 33/122 257/643 |
| 7,713,835 B2 | 5/2010 | Pillalamarri | |
| 7,889,514 B2 * | 2/2011 | Yamamichi | H01L 21/6835 174/260 |
| 7,935,780 B2 | 5/2011 | Hong et al. | |
| 8,012,288 B2 | 9/2011 | Kim et al. | |
| 8,092,628 B2 | 1/2012 | Hong et al. | |
| 8,268,449 B2 | 9/2012 | Moore et al. | |
| 8,455,872 B2 * | 6/2013 | French | H01L 27/1266 257/59 |
| 9,431,487 B2 * | 8/2016 | Bol | H01L 29/1606 |
| 2009/0218560 A1 | 9/2009 | Flaim et al. | |
| 2012/0291938 A1 | 11/2012 | Hong et al. | |
| 2013/0023109 A1 | 1/2013 | Harkness | |
| 2013/0161864 A1 * | 6/2013 | Liang | B05D 5/00 264/241 |
| 2014/0106473 A1 | 4/2014 | Andry et al. | |
| 2014/0249269 A1 * | 9/2014 | Uenda | C09D 5/20 524/726 |
| 2016/0246050 A1 * | 8/2016 | Milne | G02B 26/101 |

FOREIGN PATENT DOCUMENTS

| | | |
|---|---|---|
| KR | 10-2009-0064467 | 6/2009 |
| KR | 10-2012-0132624 | 12/2012 |

OTHER PUBLICATIONS

Zoschke et al., "Polyimide Based Temporary Wafer Bonding Technology for High Temperature Compliant TSV Backside Processing and Thin Device Handling," SUSS, Feb. 2012, www.suss.com, pp. 2-11.
Griesbach, T., "Excimer Laser Debonder for 2.5D and 3D Integration," SUSS, Nov. 2014, www.suss.com, pp. 4-8.
CIBA Specialty Chemicals Product Data, Matrimid 5218, Sep. 1, 1998, 5 pages.
International Search Report and Written Opinion dated Mar. 31, 2016 in corresponding PCT/US2015/041505 filed Jul. 22, 2015, 17 pages.

* cited by examiner (a)

(b)

POLYIMIDES AS LASER RELEASE MATERIALS FOR 3-D IC APPLICATIONS

RELATED APPLICATION

This application claims the priority benefit of a provisional application entitled POLYIMIDES AS LASER RELEASE MATERIALS FOR 3-D IC APPLICATIONS, Application No. 62/027,758, filed Jul. 22, 2014, incorporated by reference herein.

BACKGROUND OF THE INVENTION

Field of the Invention

This invention relates to the field of laser release materials for temporary wafer bonding.

Description of the Prior Art

Temporary wafer bonding (TWB) normally refers to a process for attaching a device wafer or microelectronic substrate to a carrier wafer or substrate by means of a polymeric bonding material. After bonding, the device wafer is thinned, typically to less than 50 μm, and then processed to create through-silicon vias (TSV), redistribution layers, bond pads, and other circuit features on its backside. The carrier wafer supports the fragile device wafer during the backside processing, which can entail repeated cycling between ambient temperature and high temperature (>250° C.), mechanical shocks from wafer handling and transfer steps, and strong mechanical forces, such as those imposed during wafer back-grinding processes used to thin the device wafer. When all of this processing has been completed, the device wafer is usually attached to a film frame and then separated, or debonded, from the carrier wafer and cleaned before further operations take place.

Most TWB processes use either one or two layers between the device wafer and the carrier wafer. In the case of a two-layer system, the first layer is a polymeric bonding material. It can be thermoplastic, thermosetting, or photocuring in nature. The polymeric bonding material layer is typically 10-120 μm thick and, more commonly, about 50-100 μm thick. The second layer is comparatively thin, and is present to enable facile separation of the bonded wafer pair after processing. The thin layer responds to radiation from a laser or other light source, which leads to decomposition of the layer itself or decomposition of the adjacent polymeric bonding material, causing bonding integrity to be lost within the structure and allowing it to come apart without applying mechanical force.

Laser-induced release is becoming a popular mode of debonding, and materials are available for operating at laser wavelengths ranging from the ultraviolet (e.g., 248 nm, 308 nm, and 355 nm) to the near infrared (e.g., 1064 nm). It should be noted that in some cases the polymeric bonding material has sufficient response to the laser radiation that a separate, thin light-sensitive layer is not required. However, in many, if not most, instances the use of a release layer greatly facilitates this process.

One problem with prior art laser release materials is that they require rather long curing times. For example, a curing time of one hour at 350° C. in a nitrogen environment is required to produce a film of Shin Etsu ODL-38 on the order of 1,000 Å thick. An even more complicated curing process is required for HD Microsystems HD3007, which is soft-baked at 80° C. and 120° C. and then cured at between 300° C. and 350° C. for an hour in nitrogen. These extremely long curing times significantly decrease the throughput of whole process.

There is a need for further materials suitable for use as a release layer that involve shorter cure times, while being readily susceptible to laser ablation.

SUMMARY OF THE INVENTION

The present invention broadly comprises a temporary bonding method comprising providing a stack comprising:
a first substrate having a back surface and a front surface;
a bonding layer adjacent the front surface; and
a second substrate having a first surface. The first surface includes a polyimide release layer adjacent the bonding layer. The polyimide release layer is formed from a composition comprising a polymer dissolved or dispersed in a solvent system, and the polymer comprises recurring monomers selected from the group consisting of fluorinated dianhydrides, photosensitive dianhydrides, photosensitive diamines, and combinations thereof. The release layer is exposed to laser energy so as to facilitate separation of the first and second substrates.

The invention also provides an article comprising:
a first substrate having a back surface and a front surface;
a bonding layer adjacent the front surface; and
a second substrate having a first surface. The first surface includes a polyimide release layer, with the release layer being adjacent the bonding layer. The polyimide release layer is formed from a composition comprising a polymer dissolved or dispersed in a solvent system, and the polymer comprises recurring monomers selected from the group consisting of fluorinated dianhydrides, photosensitive dianhydrides, photosensitive diamines, and combinations thereof.

The invention also provides a method of forming a polyimide release layer. The method comprises applying a composition to a substrate surface comprising glass or other transparent material. The composition comprises a polymer dissolved or dispersed in a solvent system, and the polymer is selected from the group consisting of polyamic acids and polyimides. The composition is heated at a temperature of from about 250° C. to about 350° C. for a time period of less than about 10 minutes to form the polyimide release layer.

DETAILED DESCRIPTION OF THE PREFERRED EMBODIMENTS

Inventive Method

Figure 1:
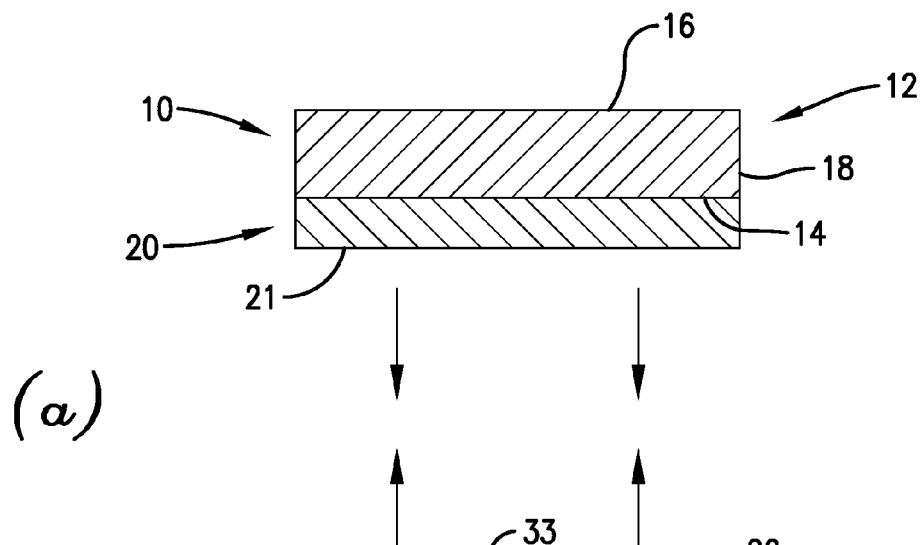
FIG. 1 is a cross-sectional view of a schematic drawing showing a preferred embodiment of the invention.
Figure 1:
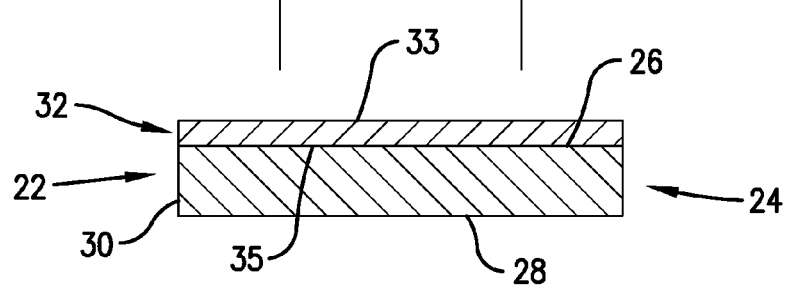
Figure 1:
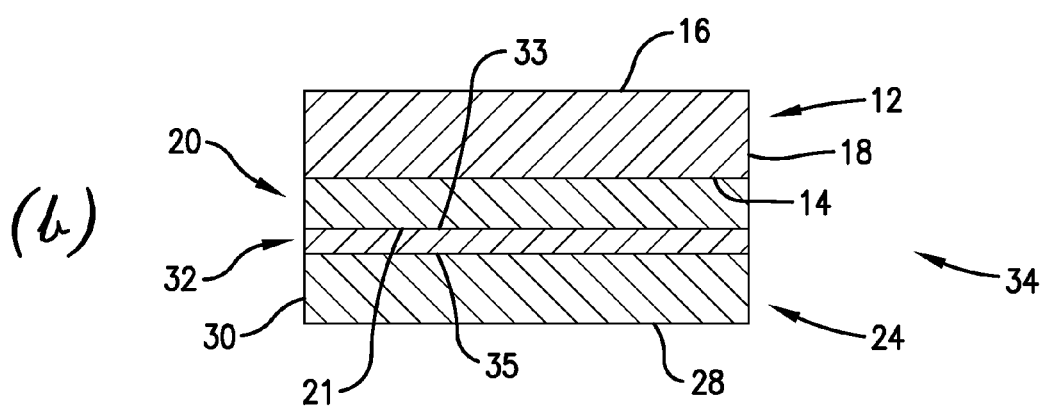

Referring to FIG. 1(a) (not to scale), a precursor structure 10 is depicted in a schematic and cross-sectional view. Structure 10 includes a first substrate 12. Substrate 12 has a front or device surface 14, a back surface 16, and an outermost edge 18. Although substrate 12 can be of any shape, it would typically be circular in shape. Preferred first substrates 12 include device wafers such as those whose device surfaces comprise arrays of devices (not shown) selected from the group consisting of integrated circuits, MEMS, microsensors, power semiconductors, light-emitting diodes, photonic circuits, interposers, embedded passive devices, and other microdevices fabricated on or from silicon and other semiconducting materials such as silicon-germanium, gallium arsenide, gallium nitride, aluminum gallium arsenide, aluminum indium gallium phosphide, and indium gallium phosphide. The surfaces of these devices commonly comprise structures (again, not shown) formed from one or more of the following materials: silicon, polysilicon, silicon dioxide, silicon (oxy)nitride, metals (e.g., copper, aluminum, gold, tungsten, tantalum), low k dielectrics, polymer dielectrics, and various metal nitrides and silicides. The device surface 14 can also include at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

A composition is applied to the first substrate 12 to form a bonding layer 20 on the device surface 14, as shown in FIG. 1(a). Bonding layer 20 has an upper surface 21 remote from first substrate 12, and preferably, the bonding layer 20 is formed directly adjacent the device surface 14 (i.e., without any intermediate layers between the bonding layer 20 and substrate 12). Although bonding layer 20 is shown to cover the entire device surface 14 of first substrate 12, it will be appreciated that it could be present on only portions or "zones" of device surface 14, as shown in U.S. Patent Publication No. 2009/0218560, incorporated by reference herein.

The bonding composition can be applied by any known application method, including dip coating, roller coating, slot coating, die coating, screen printing, draw-down coating, or spray coating. Additionally, the coatings may be formed into free-standing films before application to the device substrate or carrier substrate surface. One preferred method involves spin-coating the composition at speeds of from about 200 rpm to about 3,000 rpm (preferably from about 500 rpm to about 3,000 rpm) for a time period of from about 5 seconds to about 120 seconds (preferably from about 30 seconds to about 90 seconds).

After the composition is applied, it is preferably heated to a temperature of from about 50° C. to about 250° C., and more preferably from about 80° C. to about 220° C. and for time periods of from about 60 seconds to about 8 minutes (preferably from about 90 seconds to about 6 minutes). Depending upon the composition used to form the bonding layer 20, baking can also initiate a crosslinking reaction to cure the layer 20. In some embodiments, it is preferable to subject the layer to a multi-stage bake process, depending upon the composition utilized. Also, in some instances, the above application and bake process can be repeated on a further aliquot of the composition, so that the first bonding layer 20 is "built" on the first substrate 12 in multiple steps. The resulting layer 20 should have an average thickness (average taken over five measurements) of from about 1 µm to about 200 µm, more preferably from about 10 µm to about 150 µm, and even more preferably from about 20 µm to about 120 µm.

A second precursor structure 22 is also depicted in a schematic and cross-sectional view in FIG. 1(a). Second precursor structure 22 includes a second substrate 24. In this embodiment, second substrate 24 is a carrier wafer. That is, second substrate 24 has a front or carrier surface 26, a back surface 28, and an outermost edge 30. Although second substrate 24 can be of any shape, it would typically be circular in shape and sized similarly to first substrate 12. Preferred second substrates 24 include a clear glass wafer or any other transparent (to laser energy) substrate that will allow the laser energy to pass through the carrier substrate. One especially preferred glass carrier wafer is a Corning EAGLE XG glass wafer.

A composition is applied to the second substrate 24 to form a release layer 32 on the carrier surface 26, as shown in FIG. 1(a). Alternatively, structure 22 can be provided already formed. Release layer 32 has an upper surface 33 remote from second substrate 24, and a lower surface 35 adjacent second substrate 24. Preferably, the release layer 32 is formed directly adjacent the carrier surface 26 (i.e., without any intermediate layers between the second bonding layer 32 and second substrate 24).

The release composition can be applied by any known application method, with one preferred method being spin-coating the composition at speeds of from about 500 rpm to about 3,000 rpm (preferably from about 2,000 rpm to about 2,750 rpm) for a time period of from about 10 seconds to about 120 seconds (preferably from about 30 seconds to about 90 seconds). After the composition is applied, it is preferably heated to a temperature of from about 250° C. to about 350° C., and more preferably from about 300° C. to about 350° C. and for time periods of less than about 10 minutes, preferably from about 1 minute to about 10 minutes, and more preferably from about 2 minutes to about 5 minutes. The most preferred heating conditions are about 300° C. for about 5 minutes. This is a significant advantage over prior art laser release materials, which require significantly longer heating processes. Additionally, this heating can be carried out an ambient environment (i.e., "in air"—a nitrogen environment is not required). In embodiments where a polyamic acid composition (discussed in more detail below) is used to form the release layer 32, this heating results in imidization of the polymer. In embodiments where a polyimide composition is used to form release layer 32, this heating is simply for solvent removal.

After heating, release layer 32 preferably has an average thickness of less than about 50 µm, preferably from about 100 Å to about 50 µm, and more preferably from about 1,000 Å to about 3,000 Å. In another embodiment, release layer 32 has an average thickness of less than about 10,000 Å, preferably from about 100 Å to about 5,000 Å, more preferably from about 500 Å to about 3,000 Å, even more preferably from about 500 Å to about 2,000 Å, and most preferably about 1,500 Å.

Referring to structure 22 of FIG. 1(a) again, although release layer 32 is shown to cover the entire surface 26 of second substrate 24, it will be appreciated that it could be present on only portions or "zones" of carrier surface 26 similar to as was described with bonding layer 20.

Of particular significance is that the release layer 32 is substantially insoluble in typical processing chemicals after curing, thus preventing it from being degraded and releasing prematurely (i.e., prior to laser ablation). That is, the cured release layer 32 will be substantially insoluble in typical processing chemicals such as cyclohexanone, ethyl lactate, propylene glycol methyl ether acetate, propylene glycol monomethyl ether, N-methylpyrrolidinone, HF, $H_3PO_4$, $H_2O_2$, tetramethylammonium hydroxide, and mixtures thereof. Thus, when subjected to a stripping test, the cured release layers 32 will have a percent stripping of less than about 5%, preferably less than about 1%, and even more preferably about 0%. The stripping test involves first determining the thickness (by taking the average of measurements at five different locations) of the cured release layer 32. This is the initial average film thickness. Next, a solvent (e.g., ethyl lactate) is puddled onto the cured film for about 20 seconds, followed by spin drying at about 3,000 rpm for about 30 seconds to remove the solvent. The thickness is measured again at five different points on the wafer using ellipsometry, and the average of these measurements is determined. This is the average final film thickness.

The amount of stripping is the difference between the initial and final average film thicknesses. The percent stripping is:

$$\% \text{ stripping} = \left(\frac{\text{amount of stripping}}{\text{initial average film thickness}}\right) \times 100.$$

Structures 10 and 22 are then pressed together in a face-to-face relationship, so that upper surface 21 of bonding layer 20 is in contact with upper surface 33 of release layer 32 (FIG. 1(*b*)). While pressing, sufficient pressure and heat are applied for a sufficient amount of time so as to effect bonding of the two structures 10 and 22 together to form bonded stack 34. The bonding parameters will vary depending upon the composition from which bonding layer 20 is formed, but typical temperatures during this step will range from about 150° C. to about 375° C., and preferably from about 160° C. to about 350° C., with typical pressures ranging from about 1,000 N to about 25,000 N, and preferably from about 3,000 N to about 20,000 N, for a time period of from about 30 seconds to about 20 minutes, preferably from about 3 minutes to about 10 minutes, and more preferably from about 3 minutes to about 5 minutes.

In an alternative embodiment, it will be appreciated that bonding layer 20 could be applied to upper surface 33 of release layer 32, using the application process described previously, rather than being applied to surface 14 of first substrate 12. In this instance, the first substrate 12 would then be subjected to the above bonding process so as to bond surface 14 of first substrate 12 to bonding layer 20, which was previously formed on upper surface 33 of release layer 32.

Regardless of which embodiment was used to form the bonded stack 34, the first substrate 12 can now be safely handled and subjected to further processing that might otherwise have damaged first substrate 12 without being bonded to second substrate 24. Thus, the structure can safely be subjected to backside processing such as back-grinding, chemical-mechanical polishing ("CMP"), etching, metal deposition (i.e., metallization), dielectric deposition, patterning (e.g., photolithography, via etching), passivation, annealing, and combinations thereof, without separation of substrates 12 and 24 occurring, and without infiltration of any chemistries encountered during these subsequent processing steps. Not only can bonding layer 20 and release layer 32 survive these processes, it can also survive processing temperatures up to about 450° C., preferably from about 200° C. to about 400° C., and more preferably from about 200° C. to about 350° C.

Once processing is complete, the substrates 12 and 24 can be separated by using a laser to decompose or ablate all or part of the laser release layer 32. Suitable lasers include excimer lasers at 248 nm, 308 nm, and 355 nm. In order to debond the laser release layer, a laser is scanned across the surface of the carrier wafer in a stand-and-repeat method or line scan method in order to expose the entire wafer. Exemplary laser debonding tools include the SUSS MicroTec Lambda STEEL 2000 laser debonder and Kingyoup laser debonder. When using a SUSS MicroTec Lambda STEEL 2000 laser debonder, the wafer is preferably scanned by the laser spot with the field size of 12.5×4 mm. Suitable dosages to debond the substrates are from about 100 mJ/cm$^2$ to about 400 mJ/cm$^2$, preferably from about 150 mJ/cm$^2$ to about 350 mJ/cm$^2$. When using a Kingyoup laser debonder, the wafer is preferably scanned by the laser line using a laser pixel size of 100 μm with a 140 μm pitch overlapping. Suitable intensity to debond the substrates are from about 2.5 W to about 6 W, preferably from about 3 W to about 4 W.

A low mechanical force (e.g., finger pressure, gentle wedging, suction cup) can then be applied to completely separate the substrates 12 and 24. After separation, any remaining bonding layer 20 can be removed with a solvent capable of dissolving the particular layer 20.

In the above embodiments, the release layer 32 is shown on a second substrate 24 that is a carrier wafer, while bonding layer 20 is shown on a first substrate 12 that is a device wafer. It will be appreciated that this substrate/layer scheme could be reversed. That is, the release layer 32 could be formed on first substrate 12 (the device wafer) while bonding layer 20 is formed on second substrate 24 (the carrier wafer). The same compositions and processing conditions would apply to this embodiment as those described above, except that bonding layer 20 would be selected so that laser energy could pass through it, after passing through second substrate 24, thus allowing the laser energy to make contact with release layer 32.

Additionally, it will be appreciate that bonding layer 20 and release layer 32 could be used with or as additional bonding materials, structural support layers, lamination aid layers, tie layers (for adhesion to initial substrate), contamination control layers, and cleaning layers. Preferred structures and application techniques will be dictated by application and process flow.

Bonding Composition

The compositions for use in forming bonding layer 20 can be selected from commercially available bonding compositions that would be capable of being formed into a layer possessing the above adhesive properties, while being removable by heat and/or solvent. These materials should be capable of forming a strong adhesive bond with the first and second substrates 12 and 24, respectively. Anything with an adhesion strength of greater than about 50 psig, preferably from about 80 psig to about 250 psig, and more preferably from about 100 psig to about 150 psig, as determined by ASTM D4541/D7234, would be desirable for use as bonding layer 20.

Typical such compositions are organic and will comprise a polymer or oligomer dissolved or dispersed in a solvent system. The polymer or oligomer is typically selected from the group consisting of polymers and oligomers of cyclic olefins, epoxies, acrylics, silicones, styrenics, vinyl halides, vinyl esters, polyamides, polyimides, polysulfones, polyethersulfones, cyclic olefins, polyolefin rubbers, polyurethanes, ethylene-propylene rubbers, polyamide esters, polyimide esters, polyacetals, and polyvinyl butyral. Typical solvent systems will depend upon the polymer or oligomer selection. Typical solids contents of the compositions will range from about 1% to about 60% by weight, and preferably from about 3% by weight to about 40% by weight, based upon the total weight of the composition taken as 100% by weight. Some suitable compositions are described in U.S. Pat. Nos. 8,268,449, 7,713,835, 7,935,780, and 8,092,628, each incorporated herein by reference.

Release Layer Composition

The laser release materials broadly comprise a polymer dissolved or dispersed in a solvent system. In one embodiment, the polymer is a polyamic acid. In another embodiment, the polymer is a polyimide.

The polyamic acids are preferably synthesized using condensation polymerization by mixing dianhydride and diamine monomers in a specific solvent (e.g., gamma-butyrolactone, cyclohexanone, propylene glycol methyl ether acetate, propylene glycol monomethyl ether) to form a polyamic acid precursor solution. End-capping agents are then preferably added to eliminate the terminal functional groups in order to prevent possible aging afterward. Commercially available polyamic acids containing a photosensitive dianhydride may also be used as a laser release material. There are also commercially available polyimides, thus avoiding the need to imidize the formed layer during baking.

Preferred dianhydrides include those selected from the group consisting of monomers of fluorinated dianhydrides (e.g., 2,2'-bis-(dicarboxyphenyl)hexafluoropropane dianhydride ("6FDA")), photosensitive dianhydrides (e.g., 3,3',4, 4'-benzophenone tetracarboxylic dianhydride ("BTDA")), and combinations thereof. Preferred diamines comprise aromatic diamines (e.g., 9,9'-bis(4-aminophenyl) fluorine ("FDA"), 5(6)-amino-1-(4' aminophenyl)-1,3,-trimethylindane). The incorporation of strongly UV-absorbing or UV-sensitive monomers like BTDA facilitates high laser ablation efficiency.

The weight average molecular weight of the polymer is from about 1,000 Daltons to about 100,000 Daltons, more preferably from about 5,000 Daltons to about 75,000 Daltons, and even more preferably from about 10,000 Daltons to about 20,000 Daltons. The laser release compositions preferably comprises from about 3% to about 25% by weight solids, more preferably from about 5% to about 20% by weight solids, and even more preferably from about 5% to about 10% by weight solids, based upon the total weight of the composition taken as 100% by weight. Typical solvent systems for use with the release layer composition comprise a solvent selected from the group consisting of cyclohexanone, cyclopentanone, propylene glycol monomethyl ether, gamma-butyrolactone, ethyl 3-ethoxypropionate, propoxy propanol ("PnP"), propylene glycol methyl ether acetate, ethyl lactate, and mixtures thereof.

As noted above, end-capping agents are preferably used to increase the stability of the final product by capping the terminal amine and consuming the extra diamine in the reaction solution. Preferably, an aromatic mono-anhydride is used as end-capping agent. One especially preferred end-capping agent is phthalic anhydride. The molar feed ratio of dianhydride:diamine:end-capping agent is preferably from about 0.7:1:0.3 to about 0.98:1:0.02, more preferably from about 0.85:1:0.15 to about 0.95:1:0.05.

Advantageously, the laser release layer will have low sublimation. When subjected to high-performance liquid chromatography (HPLC), the polymer solution will exhibit less than about 700 ppm monomer residues, preferably less than about 400 ppm, more preferably less than about 120 ppm monomer residues, and even more preferably less than 40 ppm monomer residues.

EXAMPLES

The following examples set forth preferred methods in accordance with the invention. It is to be understood, however, that these examples are provided by way of illustration and nothing therein should be taken as a limitation upon the overall scope of the invention.

Example 1

Polyamic Acid for Laser Debond

In this procedure, 21.12 grams of 9,9'-bis(4-aminophenyl) fluorene (FDA, Sigma-Aldrich) were dissolved in 113.16 grams of gamma-butyrolactone (GBL, Sigma-Aldrich) in 250 ml of three-necked round bottom flask. Next, 24.79 grams of 2,2'-bis-(dicarboxyphenyl)hexafluoropropane dianhydride (6FDA, SynQuest Laboratories, Inc.) were added as solid to the reaction mixture, followed by 56.58 grams of GBL. The reaction was performed at room temperature for 30 minutes with stirring. The reaction was then heated up to 60° C. and allowed to react for 1 hour. Later, 1.24 grams of phthalic anhydride (PTA, Sigma-Aldrich) and 18.86 grams of GBL were added. The reaction continued at 60° C. for 24 hours.

Example 2

Polyamic Acid for Laser Debond

In this Example, 21.12 grams of FDA were dissolved in 98.62 grams of GBL in 250 ml of three-necked round bottom flask. Next, 18.73 grams of 3,3',4,4'-benzophenone tetracarboxylic dianhydride (BTDA, Sigma-Aldrich) were added as solid to the reaction mixture, followed by addition of 49.31 grams of GBL. The reaction was performed at room temperature for 30 minutes. Then, the reaction was heated up to 60° C. and allowed to react for 1 hour. Later, 1.24 grams of PTA and 16.44 grams of GBL were added. The reaction continued at 60° C. for 24 hours.

Example 3

Polyamic Acid for Laser Debond

In this preparation, 30 grams of the mother liquor formulated in Example 1 was mixed with 70 grams of cyclohexanone to form a 6 wt % solution.

Example 4

Polyamic Acid for Laser Debond

In this procedure, 30 grams of the mother liquor formulated in Example 2 was mixed with 70 grams of cyclohexanone to form a 6 wt % solution.

Example 5

Polyimide for Laser Debond

In this Example, 3 grams of a commercial polyimide, Matrimid 5218 from Huntsman, was dissolved in 97 grams of cyclopentanone to form a 3 wt % solution.

Example 6

HPLC Testing of Compositions from Examples 1 and 2

High-performance liquid chromatography (HPLC) testing was performed on the Examples 1 and 2 polyamic acid compositions. Both samples exhibited low monomer residues (see Table 1). The content of the diamine monomer and BDL was below the detection limit of 40 ppm. The content of the dianhydride monomer was around 650 ppm. The content of PTA was below 150 ppm.

TABLE 1

| Materials | Monomer residue | | | |
|---|---|---|---|---|
| | 6FDA | BTDA | FDA | PTA |
| Example 1 | BDL | — | BDL | 480.9 ppm |
| Example 2 | — | 650 ppm | BDL | 110 ppm |

Example 7

Optical Testing of the Compositions from Examples 1, 2, and 5

Optical constants (n & k) for each polyimide release layer formed from the Examples 1, 2, and 5 compositions were determined using a variable angle spectroscopic ellipsometer (VASE). Table 2 shows the optical constants, n and k, for each of the samples.

TABLE 2

| Materials | k | | n | |
|---|---|---|---|---|
| | 308 nm | 355 nm | 308 nm | 355 nm |
| Example 1 | 0.094 | 0.01 | 1.83 | 1.74 |
| Example 2 | 0.136 | 0.024 | 1.95 | 1.83 |
| Example 5 | 0.094 | 0.03 | 1.89 | 1.77 |

Example 8

Thermal Testing of Polyimide Films Formed from Examples 1, 2, and 5 Compositions Polymer films for thermal stability test were prepared by spin coating of the materials formulated in Examples 1, 2, and 5 onto 4-inch silicon wafer at 800 rpm with a ramp of 3,000 rpm/s for 10 seconds. Each sample was then baked at 350° C. for 5 minutes to cure and convert the polyamic acid to a polyimide and remove solvent (Example 1 and 2) or to only remove solvent if the polymer was already imidized (Examples 5). The decomposition temperature for each polyimide sample was then determined using thermogravimetric analysis (TGA) with the rate of 10° C./min up to 700° C. in air atmosphere. Table 3 shows the $T_d$ for each of the samples. Additionally, each sample was put through a heat treatment at 350° C. for 1 hour, and no sign of decomposition was detected for either sample.

TABLE 3

| Materials | $T_d$ |
|---|---|
| Example 1 | 525° C. |
| Example 2 | 558° C. |
| Example 5 | 450° C. |

Example 9

Laser Debonding Performance of Polyimide Release Material from Example 3 Composition with BrewerBOND® 305 Material The laser debonding performance of the polyimide film formed from heating and imidizing the Example 3 polyamic acid composition was tested using both 308-nm and 355-nm lasers after bonding with BrewerBOND® 305 material as the bonding composition. In this example, a 200-mm Corning EAGLE XG glass wafer was coated with the polyamic acid composition from Example 3 at 2,500 rpm, with a 5,000 rpm/s acceleration for 60 seconds to give a coating thickness of 150 nm. The wafer was then baked at 300° C. for 5 min to yield the polyimide release layer. A 50-μm coat of BrewerBOND® 305 material was coated on a 200-mm silicon wafer by spin coating the material at 1,000 rpm, with a 3,000 rpm/s acceleration for 30 seconds. The wafer was then baked at 60° C. for 3 minutes, 160° C. for 2 minutes, and 200° C. for 2 minutes. The wafer pair was then bonded at 200° C., 1800 N, for 2 minutes under vacuum (<5 mbar) using an EVG Model 510 bonder. The bonded pair was then placed on a hot plate at 260° C. for 30 min. There were no voids or defects observed after the heat treatment. After heat treatment the wafer pair was successfully debonded using 308-nm laser debonder from SUSS with a laser dose of 230 mJ/cm$^2$. The top glass carrier wafer was easily lifted off with suction cup. The scanning time was less than 40 seconds. A similar wafer pair was also debonded using a 355-nm laser debonder from Kingyoup using an intensity of more than 4 W within 45 seconds.

Example 10

Laser Debonding Performance of Polyimide Release Layer Formed from Example 4 Composition with BrewerBOND® 305 Material Two bonded stacks were prepared using the same parameters as Example 9, only the polyamic acid composition from Example 4 was used in place of the polyamic acid composition of Example 3. Much better laser debonding performance was observed. A laser dose of 170 mJ/cm$^2$ was needed for the successful debonding by a 308-nm laser after a heat treatment of 260° C. for 30 minutes, much less than the laser dose in Example 9. In addition, 4 W of laser intensity is required for successful debonding when using a 355-nm laser debonder for the similar wafer pair.

Example 11

Laser Debonding Performance of Polyimide Release Layer Formed from Example 5 Composition with BrewerBOND® 305 Material Two bonded stacks were prepared using the same parameters as Example 9, only the polyimide composition from Example 5 was used in place of the polyamic acid composition of Example 3. The polyimide release layer formed from the Example 5 composition showed comparable laser debonding performance as the polyimide release layer formed from the Example 4 composition, due to the presence of BTDA in the molecular structure. Laser energy of 180 mJ/cm$^2$ and 4 W were used for the successful debonding by using both 308-nm and 355-nm laser debonders.

Example 12

Laser Debonding Performance of Polyimide Release Layer Formed from Examples 4 and 5 Compositions with an Experimental Polyethersulfone Bonding Material The laser debonding performance of polyimide release layers formed from the Examples 4 and 5 compositions was also investigated with an experimental polyethersulfone bonding material (Brewer Science, Inc., Rolla, Mo.) for higher temperature applications, such as 300° C. to 350° C. A 20-μm coat of the experimental bonding material was coated on an 200-mm silicon wafer by spin coating the material at 1,000 rpm, with 3,000 rpm/s acceleration for 30 seconds. The wafer was then baked at 50° C. for 5 minutes, 120° C. for 2 minutes, and 200° C. for 2 minutes. The wafer pair was then bonded at 380° C., 8,000 N, for 10 minutes under vacuum (<5 mbar) using an EVG Model 510 bonder. The bonded pair was then placed on a hot plate at 350° C. for an hour. There were no voids or defects observed after the heat treatment. Again, both laser release materials showed comparable performance in this test. Laser doses of 200 mJ/cm$^2$ and 220 mJ/cm$^2$ were the minimum values for successful debonding for the polyimide release layers from Example 4 and 5, respectively, when using a 308-nm laser debonder from SUSS.

Example 13

Chemical Resistance of Polyimide Release Layers Formed from Example 4 Composition The polyimide release layer formed from the Example 4 composition presented excellent chemical resistance to various chemicals used during downstream process. Table 4 shows the results of chemical resistance of this polyimide release layer.

TABLE 4

| Chemicals | Type | Bath temp | Mix | Time | Result |
| --- | --- | --- | --- | --- | --- |
| Cyclohexanone | Solvent | 25° C. | n/a | 10 min | No defects |
| Ethyl lactate | Solvent | 25° C. | n/a | 10 min | No defects |
| PGMEA | Solvent | 40° C. | n/a | 10 min | No defects |
| PGME | Solvent | 70° C. | n/a | 10 min | No defects |
| NMP | Solvent | 70° C. | n/a | 10 min | No defects |
| HF/deionized water | Acid | 25° C. | 1:10 | 10 min | No defects |
| H$_3$PO$_4$ | Acid | 25° C. | 5% | 10 min | No defects |
| H$_2$O$_2$ | Oxidizer | 50° C. | 20% | 10 min | No defects |
| TMAH | Base | 70° C. | 2.38% | 10 min | No defects |

We claim:

1. A temporary bonding method comprising:
   providing a stack comprising:
   a first substrate having a back surface and a front surface;
   a bonding layer adjacent said front surface; and
   a second substrate having a first surface, said first surface including a polyimide release layer adjacent said bonding layer, wherein said polyimide release layer is formed from a composition comprising a polymer dissolved or dispersed in a solvent system, said polymer comprising recurring monomers selected from the group consisting of fluorinated dianhydrides, photosensitive dianhydrides, photosensitive diamines, and combinations thereof; and
   exposing said polyimide release layer to laser energy so as to facilitate separation of said first and second substrates.

2. The method of claim 1, said release layer having an average thickness of less than about 50 μm.

3. The method of claim 1, wherein said exposing is carried out at a dosage of from about 100 mJ/cm$^2$ to about 400 mJ/cm$^2$.

4. The method of claim 1, wherein said polymer comprises recurring monomers selected from the group consisting of 2,2'-bis-(dicarboxyphenyl)hexafluoropropane dianhydride, 3,3',4,4'-benzophenone tetracarboxylic dianhydride, 9,9'-bis(4-aminophenyl) fluorine, 5(6)-amino-1-(4' aminophenyl)-1,3,-trimethylindane, and combinations thereof.

5. The method of claim 1, said solvent system comprising a solvent selected from the group consisting of cyclohexanone, cyclopentanone, propylene glycol monomethyl ether, gamma-butyrolactone, ethyl 3-ethoxypropionate, propoxy propanol, propylene glycol methyl ether acetate, ethyl lactate, and mixtures thereof.

6. The method of claim 1, further comprising forming said release layer by applying said composition to said first surface.

7. The method of claim 6, further comprising heating said composition at a temperature of from about 250° C. to about 350° C. for a time period of less than about 10 minutes.

8. The method of claim 1, wherein said bonding layer is formed from a composition comprising a polymer or oligomer dissolved or dispersed in a solvent system, said polymer or oligomer being selected from the group consisting of polymers and oligomers of cyclic olefins, epoxies, acrylics, styrenics, vinyl halides, vinyl esters, polyamides, polyimides, polysulfones, polyethersulfones, cyclic olefins, polyolefin rubbers, polyurethanes, ethylene-propylene rubbers, polyamide esters, polyimide esters, polyacetals, and polyvinyl buterol.

9. The method of claim 1, wherein said front surface is a device surface that comprises an array of devices selected from the group consisting of integrated circuits; MEMS; microsensors; power semiconductors; light-emitting diodes; photonic circuits; interposers; embedded passive devices; and microdevices fabricated on or from silicon, silicon-germanium, gallium arsenide, and gallium nitride.

10. The method of claim 1, wherein said first surface is a device surface that comprises an array of devices selected from the group consisting of integrated circuits; MEMS; microsensors; power semiconductors; light-emitting diodes; photonic circuits; interposers; embedded passive devices; and microdevices fabricated on or from silicon, silicon-germanium, gallium arsenide, and gallium nitride.

11. The method of claim 1, wherein said second substrate comprises glass or other transparent material.

12. The method of claim 1, wherein said first substrate comprises glass or other transparent material.

13. The method of claim 1, wherein said front surface is a device surface comprising at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

14. The method of claim 1, wherein said first surface is a device surface comprising at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

15. The method of claim 1, further comprising subjecting said stack to processing selected from the group consisting of back-grinding, chemical-mechanical polishing, etching, metallizing, dielectric deposition, patterning, passivation, annealing, and combinations thereof, prior to separating said first and second substrates, prior to separating said first and second substrates.

\* \* \* \* \*